US008679942B2

(12) United States Patent
Letertre et al.

(10) Patent No.: US 8,679,942 B2
(45) Date of Patent: Mar. 25, 2014

(54) STRAIN ENGINEERED COMPOSITE SEMICONDUCTOR SUBSTRATES AND METHODS OF FORMING SAME

(75) Inventors: Fabrice Letertre, Meylan (FR); Jean-Marc Bethoux, Grenoble (FR); Alice Boussagol, Villard Bonnot (FR)

(73) Assignee: Soitec, Bernin (FR)

( * ) Notice: Subject to any disclaimer, the term of this patent is extended or adjusted under 35 U.S.C. 154(b) by 701 days.

(21) Appl. No.: 12/610,065

(22) Filed: Oct. 30, 2009

(65) Prior Publication Data

US 2010/0127353 A1 May 27, 2010

Related U.S. Application Data

(60) Provisional application No. 61/118,236, filed on Nov. 26, 2008.

(51) Int. Cl.
*H01L 29/20* (2006.01)

(52) U.S. Cl.
USPC 438/458; 257/615; 257/E21.09; 257/E29.089

(58) Field of Classification Search
USPC .................................................. 438/455–459
See application file for complete search history.

(56) References Cited

U.S. PATENT DOCUMENTS

| 6,303,468 | B1 | 10/2001 | Aspar et al. |
| 6,335,258 | B1 | 1/2002 | Aspar et al. |
| 6,756,286 | B1 | 6/2004 | Moriceau et al. |
| 6,809,044 | B1 | 10/2004 | Aspar et al. |
| 6,946,365 | B2 | 9/2005 | Aspar et al. |
| RE39,484 | E | 2/2007 | Bruel |
| 2002/0182827 | A1* | 12/2002 | Abe et al. ................. 438/455 |
| 2005/0153524 | A1* | 7/2005 | Maa et al. ................. 438/458 |
| 2005/0269671 | A1 | 12/2005 | Faure et al. |
| 2006/0099776 | A1 | 5/2006 | Dupont |
| 2007/0072324 | A1 | 3/2007 | Krames et al. |
| 2007/0173037 | A1* | 7/2007 | Nastasi et al. ............. 438/475 |
| 2008/0001165 | A1* | 1/2008 | Hashimoto et al. ........ 257/103 |

OTHER PUBLICATIONS

Kawaharazuka et al., J. of Crystal Growth, 301 414 2007.
Rogers et al., Applied Physics Letters, 91 071120 2007.
Armitage et al., Applied Physics Letter 81, 1450, 2002.
Moram et al., Journal of Crystal Growth 298, 268 2007.
Collazo et al., J. Crystal Growth 287 (2006) 586-590.
Stutzmann et al., Phys. Stat. Sol. (b) 228, No. 2, 505-512 (2001).
International Search Report for PCT/IB2008/003597 dated Aug. 31, 2009.
Chinese Search Report for Chinese Application No. 200880132349.3 dated Apr. 25, 2013, 2 pages.
Chinese Office Action for Chinese Application No. 200880132349.3 dated May 6, 2013, 5 pages.

* cited by examiner

*Primary Examiner* — David Vu
*Assistant Examiner* — Jonathan Han
(74) *Attorney, Agent, or Firm* — TraskBritt

(57) ABSTRACT

Composite substrates are produced that include a strained III-nitride material seed layer on a support substrate. Methods of producing the composite substrate include developing a desired lattice strain in the III-nitride material to produce a lattice parameter substantially matching a lattice parameter of a device structure to be formed on the composite substrate. The III-nitride material may be formed with a Ga polarity or an N polarity. The desired lattice strain may be developed by forming a buffer layer between the III-nitride material and a growth substrate, implanting a dopant in the III-nitride material to modify its lattice parameter, or forming the III-nitride material with a coefficient of thermal expansion (CTE) on a growth substrate with a different CTE.

32 Claims, 3 Drawing Sheets

US 8,679,942 B2

STRAIN ENGINEERED COMPOSITE SEMICONDUCTOR SUBSTRATES AND METHODS OF FORMING SAME

CROSS-REFERENCE TO RELATED APPLICATION

This application claims the benefit under 35 U.S.C. §119 (e) of U.S. Provisional Application No. 61/118,236, filed Nov. 26, 2008, which is incorporated herein by reference.

FIELD OF THE INVENTION

The present invention generally relates to the fabrication of engineered substrates for use in the fabrication of semiconductor structures or devices, intermediate structures formed during the fabrication of semiconductor structures or devices, and to semiconductor structures or devices using engineered substrates.

BACKGROUND OF THE INVENTION

Substrates that include one or more layers of semiconductor material are used to form a wide variety of semiconductor structures and devices including, for example, integrated circuit (IC) devices (e.g., logic processors and memory devices), radiation-emitting devices (e.g., light-emitting diodes (LEDs), resonant cavity light-emitting diodes (RCLEDs), and vertical cavity surface-emitting lasers (VCSELs)), and radiation sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is actually used to form active devices on the silicon wafer.

It has been discovered that the speed and power efficiency of semiconductor devices can be improved by electrically insulating the portion of the semiconductor material on a semiconductor substrate that is actually used to form the semiconductor devices from the remaining bulk semiconductor material of the substrate. As a result, so-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively larger host or base substrate to facilitate handling of the overall engineered substrate by manufacturing equipment. As a result, the base substrate is often referred to in the art as a "handle" or "handling" substrate. The base substrate may also comprise a semiconductor material other than silicon.

A wide variety of engineered substrates are known in the art and may include semiconductor materials such as, for example, silicon (Si), germanium (Ge), III-V type semiconductor materials, and II-VI type semiconductor materials.

For example, an engineered substrate may include an epitaxial layer of III-V type semiconductor material formed on a surface of a base substrate, such as, for example, aluminum oxide ($Al_2O_3$) (which may be referred to as "sapphire"). Using such an engineered substrate, additional layers of material may be formed and processed (e.g., patterned) over the epitaxial layer of III-V type semiconductor material to form one or more devices on the engineered substrate.

Strain in semiconductor layers, for example, in III-nitride materials, can be undesirable for a number of reasons. Strained layers generally result in an increased density of defects/dislocations and may even result in crack formation in films. For example, strain effects are a major detriment to high indium content InGaN light-emitting devices as the increased indium percentage required for such devices introduces elevated strain levels. These layers can only be grown at extremely small thicknesses and low indium content to prevent the onset of phase separated material and the resulting non-uniform distribution of indium through the layer, making for an impractical approach for achieving material goals.

One way strain is induced is through the temperature changes that semiconductor layers may experience during processing. When a layer of semiconductor material is formed (e.g., epitaxially grown) over another layer of material (e.g., an underlying layer of a different semiconductor material) at elevated temperatures, as the resulting structure cools to room temperature lattice strain may be induced in the crystal lattice of the layer of semiconductor material due to any difference in the coefficients of thermal expansion (CTE) exhibited by the respective adjacent materials. If the underlying material exhibits a coefficient of thermal expansion that is higher than the coefficient of thermal expansion exhibited by the semiconductor material, the semiconductor material may be disposed in a state of compressive strain upon cooling the resulting structure. In contrast, if the underlying material exhibits a coefficient of thermal expansion that is less than the coefficient of thermal expansion exhibited by the semiconductor material, the semiconductor material may be disposed in a state of tensile strain upon cooling the resulting structure. There are various semiconductor devices and processes in which such lattice strain imposes limitations on the devices that can be fabricated.

The use of relaxed (i.e., unstrained) GaN as a seed for the growth of InGaN/AlGaN films is limited to extremely small thicknesses and low indium/aluminum content to prevent, in the case of InGaN, the onset of phase separated material and the resulting non-uniform distribution of indium through the layer or, in the case of AlGaN, the possible cracking of films. As an example, films with an indium content larger than 7% are difficult to grow thick (i.e., >500 nm) as the film can phase separate and hence be degraded by lattice mismatch induced strain effects.

In view of the above, there is a need for a substrate technology providing the appropriate lattice parameter to reduce or cancel the lattice mismatch with epitaxial film that will be grown or deposited thereon.

BRIEF SUMMARY

The embodiments of the present invention are concerned with producing a composite substrate comprising a strained III-nitride material seed layer (e.g., GaN, etc.) on a support substrate (e.g., GaN-on-sapphire GANOS or GaN-on-insulator GANOI, etc.) with a lattice parameter substantially matching a device structure (e.g., an InGaN-based light emitter) to be formed on the composite substrate.

In some embodiments, a method of fabricating a semiconductor substrate includes forming a strained donor structure by forming a III-nitride material on a first substrate with a desired lattice strain and a Ga-face on a first surface of the III-nitride material and an N-face on a second surface of the III-nitride material. An attachment surface is selected, wherein the attachment surface is the first surface to form an N-polar composite substrate or the second surface to form a Ga-polar composite substrate. A weakened zone is formed in the strained donor structure at a predetermined depth to define a strained seed layer between the attachment surface and the weakened zone and a residual strained donor structure between the weakened zone and a surface opposite the attachment surface. The method also includes bonding a support substrate to the attachment surface of the III-nitride material and separating the residual strained donor structure from the strained seed layer at the weakened zone to form a strained composite substrate comprising the support substrate and the strained seed layer.

In other embodiments, a method of fabricating a semiconductor substrate includes forming a strained donor structure by forming a III-nitride material on a growth substrate with a desired lattice strain and a Ga-face on a first surface of the III-nitride material. A weakened zone is formed in the strained donor structure at a predetermined depth to define a strained seed layer between the first surface and the weakened zone and a residual strained donor structure between the weakened zone and the growth substrate. The method also includes bonding a support substrate to the first surface of the III-nitride material and separating the strained donor structure from the strained seed layer at the weakened zone to form a strained composite substrate comprising the support substrate and the strained seed layer.

In yet further embodiments, a method of fabricating a semiconductor substrate includes forming a strained donor structure. The donor structure is formed by forming a III-nitride material on a growth substrate with a desired lattice strain and a Ga-face on a first surface of the III-nitride material, bonding a carrier substrate to the first surface, and removing the growth substrate to expose a second surface of the III-nitride material with an N-face. The method also includes forming a weakened zone in the strained donor structure at a predetermined depth to define a strained seed layer between the second surface and the weakened zone and a residual strained donor structure between the weakened zone and the first surface. The method also includes bonding a support substrate to the second surface of the III-nitride material and separating the strained donor structure from the strained seed layer at the weakened zone to form a strained composite substrate comprising the support substrate and the strained seed layer.

In yet further embodiments, a strained composite substrate includes a support substrate and a strained seed layer including a III-nitride material disposed on the support substrate. The strained seed layer is detached from a strained donor structure comprising the III-nitride material with a desired lattice strain formed on a second support substrate.

In yet further embodiments, a semiconductor device includes a strained composite substrate and semiconductor device layers disposed on the strained composite substrate to form at least one electronic element, at least one photonic element, or a combination thereof on the semiconductor device. The strained composite substrate includes a support substrate and a strained seed layer including a III-nitride material disposed on the support substrate. The strained seed layer is detached from a strained donor structure comprising the III-nitride material with a desired lattice strain formed on a second support substrate.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the description of the invention when read in conjunction with the accompanying drawings, in which:

DETAILED DESCRIPTION OF THE INVENTION

Figure 1A:
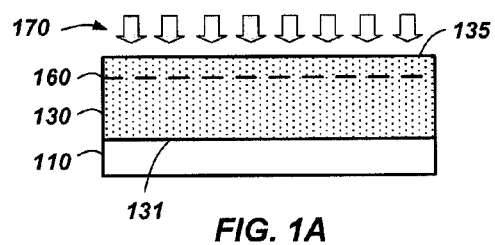
FIGS. 1A-1D are simplified cross-sectional views of structures that may be formed during various actions of developing a strained composite substrate and strained donor structure.

The illustrations presented herein are not meant to be actual views of any particular material, apparatus, system, or method, but are merely idealized representations, which are employed to describe the present invention. Additionally, elements common between figures may retain the same numerical designation.

As used herein, the term "III-V type semiconductor material" means and includes any material predominantly comprised of one or more elements from group IIIA of the periodic table (B, Al, Ga, In, and Ti) and one or more elements from group VA of the periodic table (N, P, As, Sb, and Bi).

As used herein, the term "coefficient of thermal expansion," when used with respect to a material or structure, means the average linear coefficient of thermal expansion of the material or structure at room temperature.

As used herein, the term "engineered substrate," in its broadest sense, means and includes any substrate comprising two or more layers of material and that is intended to be used as a substrate for the fabrication of one or more semiconductor devices thereon. Engineered substrates include, as non-limiting examples, semiconductor-on-insulator type substrates.

As used herein, the term "epitaxial layer of material," means a layer of material that is at least substantially a single crystal of the material and that has been formed such that the single crystal exhibits a known crystallographic orientation.

As used herein, the term "lattice parameter" means and includes the distance between atoms of a unit cell measured in the plane of the surface.

As used herein, the term "growth lattice parameter," when used with respect to an epitaxial layer of semiconductor material, means an average lattice parameter exhibited by the layer of semiconductor material as the layer of semiconductor material is epitaxially grown at an elevated temperature.

As used herein, the term "lattice strain," when used with respect to a layer of material, means strain of the crystal lattice in directions at least substantially parallel to the plane of the layer of material. Similarly, the term "average lattice parameter," when used with respect to a layer of material, means the average lattice parameters in dimensions at least substantially parallel to the plane of the layer of material. Lattice strain may be a compressive strain or a tensile strain.

Similarly, the term "strained" is used to indicate that the crystal lattice has been deformed (e.g., stretched or compressed) from the normal spacing for such material so that its lattice spacing is different than what would normally be encountered for such material in a homogeneous relaxed crystal.

Each of the terms "relax" or "relaxed" as used herein means and includes any layer of semiconductor material that has an unstrained crystallographic structure comprising asymmetric units (such as atoms or molecules) oriented in an energetically favorable manner. The term "relaxing" means and includes changing the position of atoms in a material layer relative to the bulk positions so that the lattice strain within the material is at least partially relieved and the material nears or reaches its equilibrium lattice constant.

Headings are included herein to aid in locating certain sections of the detailed description. These headings should not be considered to limit the scope of the concepts described under any specific heading. Furthermore, concepts described in any specific heading are generally applicable in other sections throughout the entire specification.

Embodiments of the present invention are concerned with producing a composite substrate comprising a strained III-nitride seed layer (e.g., GaN, etc.) on a support (e.g., GaN-on-sapphire GANOS or GaN-on-insulator GANOI, etc.) with a lattice parameter substantially matching a device structure (e.g., an InGaN-based light emitter) to be formed thereon.

The lattice match may be configured to more closely match at a growth temperature for the device structures. The lattice parameter at growth temperature can be engineered in different ways. One method is to modify the initial stress and hence the lattice parameter (L) in the seed layer at $T_0$, i.e., pre-stressing the material $L(T_0)$. Another method is to engineer the substrate/seed layer to attain a preferred degree of strain and hence a preferred lattice parameter at growth temperature $L(\Delta T, \Delta CTE)$, i.e., the lattice parameter is a function of the growth temperature and CTE. In other words, the total stress and therefore the resultant lattice parameter can be represented as a function of temperature as $L(T)=L(T_0)+L(\Delta T, \Delta CTE)$. The present application is primarily concerned with engineering a pre-stress level in the seed layer, i.e., $L(T_0)$.

Thus, embodiments of the invention encompass methods and structures for the formation of a strain engineered III-nitride composite substrate including a strained seed layer donated from a strained donor structure. The embodiments of the invention may be optimized to produce large area strained donors with selected crystalline properties including composition and polarity. Embodiments of the invention manage the degree of strain (compressive or tensile) in the III-nitride donor structure by engineering the in-plane lattice parameter.

In addition, the lattice parameter and strain in the seed layer of the composite substrate are engineered so as improve the lattice mismatch between the seed layer and a device structure to be deposited thereon. In some embodiments, the thermal expansion coefficient of the support structure of the composite substrate is selected so as to improve the lattice mismatch between the seed layer and the device structure at the growth temperature of the device structure.

Multiple seed layers can be delaminated from the strained III-nitride material of the donor structure and transferred to a number of support structures to produce multiple engineered composite substrates from a single strained donor structure.

In some embodiments, the polarity of the strained III-nitride material of the strained donor structure can be either Ga-polar or N-polar.

The strain in the strained III-nitride material of the donor structure can be produced using a number of methods or combination of methods. As a first example, the strain in the strained III-nitride material can be produced by a coefficient of thermal expansion mismatch between the III-nitride material and the initial growth substrate upon which it was grown.

As a second example, the strain in the strained III-nitride material can be produced by a lattice mismatch between the III-nitride material and a buffer layer formed upon the initial growth substrate.

As a third example, the growth substrate, or the buffer layer upon which the III-nitride material is grown may be subjected to ion implantation to alter the lattice parameter leading to a subsequent strain in the III-nitride material.

First, the process of forming the strained donor structure, the composite substrate, and the device structure is discussed. Next, additional details for each of these three methods of inducing a strain in the donor structure are discussed below.

Element numbering used herein may refer to an element generically with a number (e.g., 110) and specifically to certain embodiments of the element with a number followed by an alpha prefix (e.g., 110A, 110B, etc.).

Strain Engineered Donor Structures

FIGS. 1A-1D are simplified cross-sectional views of structures that may be formed during various actions of developing a strained composite substrate and strained donor structure. In FIG. 1A a strained donor structure 130 comprising a III-nitride material is formed on a substrate 110.

As a non-limiting example, a detachment process described herein may use a SMARTCUT® technology. Such processes are described in detail in, for example, U.S. Pat. No. RE39,484 to Bruel, U.S. Pat. No. 6,303,468 to Aspar et al., U.S. Pat. Nos. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., and U.S. Patent Application Publication No. 2006/0099776 to Dupont, the disclosures of each of which are incorporated herein in their entirety by this reference. However, it should be understood that other processes suitable for manufacturing a compound material wafer that include utilizing predetermined weakened areas could also be used.

To perform this detachment process, a predetermined weakened zone 160 may be formed in the strained donor structure 130. FIG. 1A shows use of the SMARTCUT® technology wherein atomic species 170, such as hydrogen ions or other inert gas ions, are implanted through an attachment surface 135 with a dose and energy to create a weakened zone 160 in the strained donor structure 130. The weakened zone 160 is substantially parallel to the main attachment surface 135 and at a predetermined depth based on parameters of the atomic species implant process.

Figure 1B:
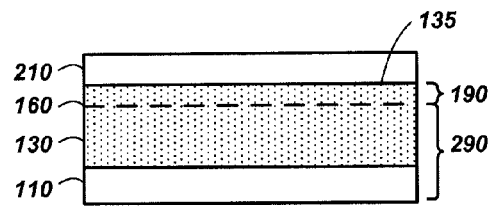

As shown in FIG. 1B, a strained seed layer 190 is thus formed between the attachment surface 135 and the weakened zone 160. In addition, a residual strained donor structure 290 is formed between the weakened zone 160 and an opposite surface from the attachment surface 135. A support substrate 210 is bonded to the attachment surface 135. The attachment surface 135 and an opposing surface of the support substrate 210 may be prepared prior to bonding to ensure adequate bonding. The entire structure of the strained donor substrate 130 and the support substrate 210 may be placed into a furnace (not shown) and heated so that the weakened zone 160 is further weakened. Instead of providing thermal energy, additional energy in other forms, for example, mechanical energy, chemical energy, or a combination of thermal, mechanical energy, and chemical energies could be used during the weakening and detachment steps.

Figure 1C:
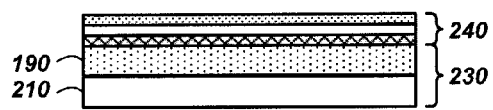
Figure 1D:
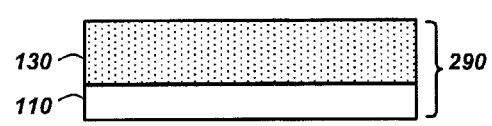

The structures thus formed after the separation are a residual strained donor structure 290 capable of donating further thin layers of strained III-nitride material, as shown in FIG. 1D and a strained composite structure 230, as shown in FIG. 1C. The strained composite structure 230 includes the strained seed layer 190 and the support substrate 210.

As shown in FIG. 1C, the composite structure may be flipped over for additional processing. Prior to performing any further processing steps, the strained composite substrate 230 may receive a surface treatment, such as, for example, polishing, cleaning, or a combination thereof. Additional processing may include, as a non-limiting example, adding device structures 240 on the strained composite structure 230. The device structures 240 may include multiple layers of doped semiconductor material, un-doped semiconductor material, and active areas as are known in the art to produce electronic elements, photonic elements, and combinations thereof.

The residual strained donor structure 290 may be re-used for forming additional strained composite structures by repeating the process as illustrated in FIGS. 1A-1D. Of course, prior to performing any further processing steps, the residual strained donor structure 290 may receive a surface treatment, such as, for example, polishing, cleaning, or a combination thereof. In addition, further strained III-nitride material may be deposited on residual strained donor structure 290 to replenish the supply of material for donation.

In some embodiments, the polarity of the strained III-nitride material of the strained donor structure 130 can be either Ga-polar or N-polar. Because the strained composite substrate is flipped, the polarity of the strained III-nitride material of the seed layer 190 in the strained composite substrate 230 is inverted from that of the III-nitride material of the strained donor structure 160. Thus, Ga-polar donor material results in an N-polar strained seed layer 190 and the N-polar donor material results in a Ga-polar strained seed layer 190. In some device applications, it may be preferable to have a Ga-polar strained seed.

Ga-Polar Strained Donor Structure

Figure 2A:
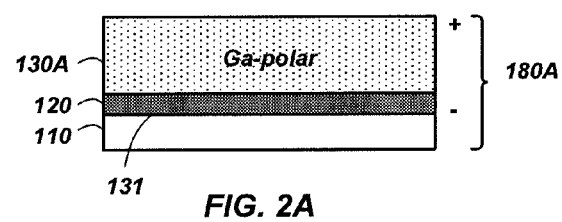
FIGS. 2A-2E are simplified cross-sectional views of structures that may be formed during various actions of developing an N-polar strained composite substrate and an GA-polar strained donor structure.

FIGS. 2A-2E are simplified cross-sectional views of structures that may be formed during various actions of developing an N-polar strained composite substrate from a Ga-polar strained donor structure. In FIG. 2A, an initial growth substrate 110 is provided as either a homogeneous or heterogeneous substrate. The growth substrate 110 includes a CTE selected to impart a desired strain level in a III-nitride material 130A, which is subsequently added to the growth substrate 110.

In some embodiments, a buffer layer 120 may be deposited on the growth substrate 110. The buffer layer 120 is described more fully below. Other embodiments may not use a buffer layer 120. A layer of III-nitride material 130A is deposited, optionally including further strain engineering buffer layers 120. The III-nitride material 130A is deposited Ga-polar polarity (Ga-polar is commonly of higher quality than N-polar and is commonly preferred for device fabrication). The resulting structure is a Ga-polar III-nitride material 130A, thus producing a strained donor structure 180A with a strained Ga-polar III-nitride material 130A on the growth substrate 110, and possibly the buffer layer 120. The material on the growth substrate is Ga-polar, however, the N-face 131 (FIG. 1A) of the Ga-polar material is in contact with the growth substrate 110 or possibly the buffer layer 120. In addition, the attachment surface 135 is a Ga-face.

The remaining actions and structures illustrated in FIGS. 2B-2E are the same as for those discussed above with respect to FIGS. 1A-1D, respectively. Thus, there is no need to discuss the details of FIGS. 2B-2E except as they refer to the polarity of the various structures.

Figure 2B:
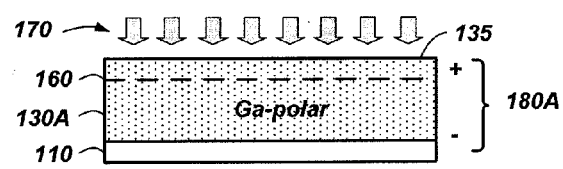
Figure 2C:
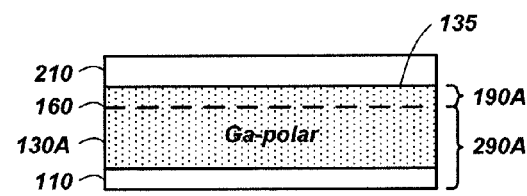
Figure 2D:
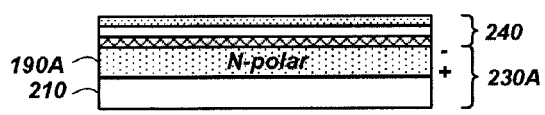
Figure 2E:

FIGS. 2B and 2C illustrate that the III-nitride material 130A is configured as Ga-polar. Similarly, FIG. 2E illustrates that the residual strained donor structure 290A is configured as Ga-polar. In FIG. 2D, the strained seed layer 190A is flipped over relative to the strained seed layer 190A as illustrated in FIG. 2C. Thus, the strained composite substrate 230A is configured as N-polar and the device structures 240 are formed on the N-face of the N-polar material.

N-Polar Strain Engineered Donor Structure

Figure 3A:
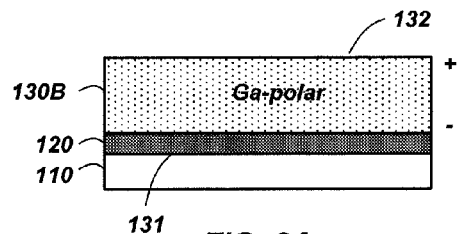
FIGS. 3A-3G are simplified cross-sectional views of structures that may be formed during various actions of developing an Ga-polar composite substrate and an N-polar strained donor structure.

FIGS. 3A-3H are simplified cross-sectional views of structures that may be formed during various actions of developing a Ga-polar composite substrate from a N-polar strained donor structure. In FIG. 3A, an initial growth substrate 110 is provided as either a homogeneous or heterogeneous substrate. The growth substrate 110 includes a CTE selected to impart a desired strain level in a III-nitride material 130B, which is subsequently added to the growth substrate 110.

In some embodiments, a buffer layer 120 may be deposited on the growth substrate 110. Other embodiments may not use a buffer layer 120.

A layer of III-nitride material 130B is deposited, optionally including further strain engineering buffer layers 120. The III-nitride material 130B is deposited Ga-polar polarity (Ga-polar is commonly of higher quality than N-polar and is commonly preferred for device fabrication). The material on the growth substrate 110 is Ga-polar, however, the N-face 131 of the Ga-polar material is in contact with the growth substrate 110 or possibly the buffer layer 120. In addition, the top surface is a Ga-face 132.

Figure 3B:
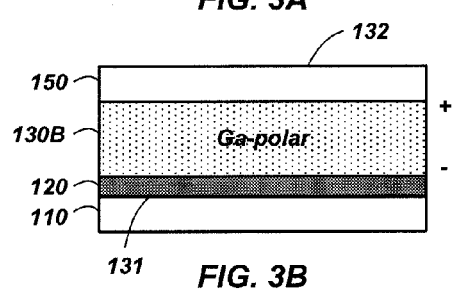

In FIG. 3B, a carrier substrate 150 is bonded to the exposed Ga-face 132 of the III-nitride material 130B. The CTE of the carrier substrate 150 may be either substantially equal to that of the growth substrate 110 so that there is no significant change in the strain level in the III-nitride material 130B, or alternatively the carrier substrate 150 may have a different CTE to the initial growth substrate 110 to further engineer the strain in the III-nitride material. Various methods for imparting strain to the III-nitride material 130B are discussed more fully below.

Figure 3C:
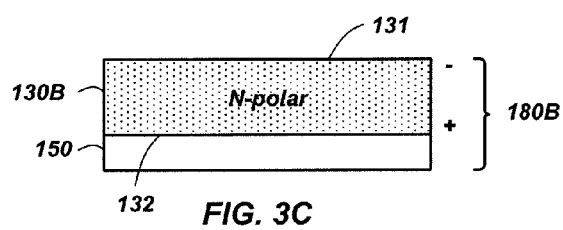

In FIG. 3C, the growth substrate 110, and optionally the buffer layer 120, is removed. The layers may be removed by grinding, etching, ion implantation, laser lift-off, or other suitable processes. The resulting structure is flipped over resulting in a polarity inverted III-nitride material 130B. As a result, a strained donor structure 180B with a strained N-polar III-nitride material 130B on a carrier substrate 150 is produced with a Ga-face 132 attached to the carrier substrate 150 and an exposed N-face 131.

The remaining actions and structures illustrated in FIGS. 3D-3G are the same as for those discussed above with respect to FIGS. 1A-1D, respectively. Thus, there is no need to discuss the details of FIGS. 3D-3G except as they refer to the polarity of the various structures.

Figure 3D:
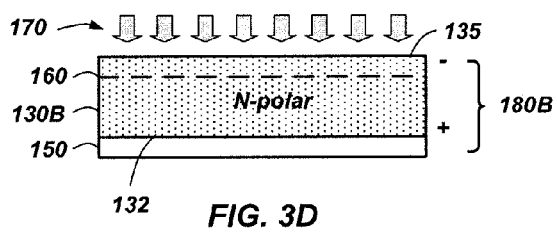
Figure 3E:
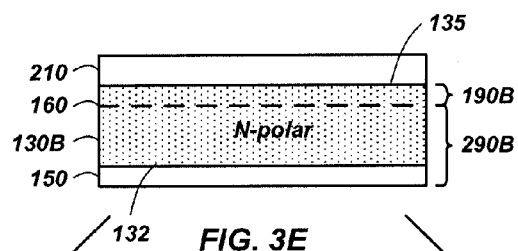
Figure 3F:
Figure 3G:
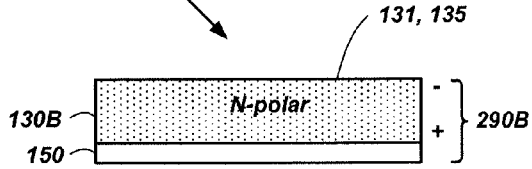

FIGS. 3D and 3E illustrate that the III-nitride material 130B is configured as N-polar (i.e., the N-face 131 is the attachment surface 135 for the support substrate 210. Similarly, FIG. 3G illustrates that the residual strained donor structure 290B is configured as N-polar. In FIG. 3F, the strained seed layer 190B is flipped over relative to the strained seed layer 190B as illustrated in FIG. 3E. Thus, the strained composite substrate 230B is configured as Ga-polar and the device structures 240 are formed on the Ga-face of the Ga-polar material.

Inducing Strain in III-Nitride Donor Structures

In any of the embodiments discussed above, strain may be induced in the strained donor structure in a number of methods. Three specific methods discussed in detail herein are strain through CTE mismatches, strain through buffer layer methods, and strain through ion implantation methods. In addition, some embodiments may include a combination of two or more different methods for inducing strain. First, each of the strain inducing methods is discussed in detail. Second, non-limiting examples of each of the strain inducing methods are discussed.

Many well-known processes may be used in forming and removing the various layers described herein. Some of these processes are: Metalorganic vapour phase epitaxy (MOVPE), Hydride Vapour Phase Epitaxy (HVPE), Molecular Beam Epitaxy (MBE), and Reactive Ion Etching (RIE).

III-Nitride Donor Structures with Strain Induced from CTE Mismatch Methods

The level and the nature (tensile or compressive) of the strain in strained III-nitride material 130 of the strained donor structure 180 can be engineered through the selection of the initial growth substrate 110, whether the growth substrate 110 may be a homogeneous material or a composite substrate made up of a plurality of dissimilar layers.

For example, consider the growth of GaN on a sapphire growth substrate. The coefficient of thermal expansion for the GaN layer is significant smaller than that of the sapphire (i.e., $5.6 \times 10^{-6 \circ}$ C.$^{-1}$ for GaN compared with $8.6 \times 10^{-6 \circ}$ C.$^{-1}$ for sapphire). Therefore, upon completion of a GaN growth cycle, (e.g., at 1100° C.) the difference in CTE upon cool down to room temperature will place the GaN layer under compressive strain and the sapphire layer under tensile strain.

In other embodiments, the III-nitride material 130 may engineered to be under tensile strain, thereby "stretching" the in-plane lattice parameter of the III-nitride material 130. Tensile strain may be preferable for the stretching of GaN lattice parameters to reduce lattice mismatch with an InGaN-based device structure 240. To achieve the transfer of tensile strain to the III-nitride material 130 of the strained donor structure 180 it is preferable to grow the III-nitride material on an initial growth substrate 110 with an average thermal expansion coefficient, which is less than that of the III-nitride material 130. As non-limiting examples, CTEs for some possible growth substrates 110 are; SiC ($4.5 \times 10^{-6 \circ}$ C.$^{-1}$), Si ($2.5 \times 10^{-6 \circ}$ C.$^{-1}$), GaAs ($5.4 \times 10^{-6 \circ}$ C.$^{-1}$), and AlAs ($3.5 \times 10^{-6 \circ}$ C.$^{-1}$). As stated earlier, it should also be appreciated that the use of substrates with a CTE value greater than those of the III-V nitrides can be utilized in alternative embodiments for introducing a compressive strain into the III-nitride donor material, these structures are desirable for obtaining AlGaN films with reduced levels of strain.

III-Nitride Donor Structure with Strain Induced Through Buffer Layer Methods

The strain in the strained III-nitride material can be caused by a lattice mismatch with one or more underlying layers by using strain inducing buffer layers 120. If the average lattice parameter of a buffer layer 120 is greater than the equilibrium lattice parameter of the III-nitride material 130, then a tensile strain is produced in the subsequent donor material. Conversely, if the average lattice parameter of the buffer layer 120 is less than the equilibrium lattice parameter of the III-nitride material 130, then a compressive strain is produced in the subsequent donor material.

A tensile strain may be preferable for stretching of the III-nitride material 130 to reduce mismatch with InGaN-based device structure layers 240, while a compressive strain may be preferable for compressing of the III-nitride material 130 to reduce mismatch with AlGaN-based device structure layers 240.

The materials of the buffer layers 120 should be substantially stable under growth conditions for III-nitrides, thus enabling in-situ deposition of suitable strain inducing buffer layers 120 followed by the deposition of the preferred III-nitride materials 130. If the deposition of the buffer layer 120 is not possible by standard III-nitride CVD techniques, the strain inducing buffer layers 120 may be deposited ex-situ, for example, by MBE, sputter deposition, or PVD.

The thickness of the III-nitride material 130 subsequently grown on the strain inducing buffer layers 120 can be maintained below the critical thickness for the on-set of strain relaxation via defect formation, therefore preserving the degree of strain introduced into the III-nitride material 130 while maintaining a reasonably low defect density. As non-limiting examples, some suitable materials for the buffer layers 120 to increase the lattice parameters of the III-nitride material 130 include, but are not limited to, suitable alloy compositions of aluminum gallium indium nitride (AlGaInN), zinc oxide (ZnO), and suitable nitrides or oxides of the transition metals, such as, hafnium nitride (HfN), scandium nitride (ScN).

III-Nitride Donor Structure with Strain Induced Through Ion Implantation Methods By doping the III-nitride material with suitable species it is possible to expand or contract the lattice constant to more suitably match a subsequent growth layer. Conventionally, it is known that silicon, a common n-type dopant for GaN, can perturb the III-nitride lattice due to the substitution of the smaller Si ion on the column III lattice site. For example, see Chine et al. (Physica Status Solidi A 203, (1954)), wherein the in-plane lattice parameter of GaN was found to increase to 3.1918 Å for a Si doping concentration of $9 \times 10^{18}$ cm$^{-3}$, from the unstrained value of 3.189 Å. In addition, see Kawaharazuka et al. (Journal of Crystal Growth, 301, p. 414, (2007)) wherein the introduction of Be and Mg dopants into the GaN lattice introduced a compressive strain.

As non-limiting examples, the ionic species may be introduced into the lattice by diffusion processes, ion implantation, or a combination thereof. In some embodiments, a thin buffer layer of nitride material may be deposited on the surface of the growth substrate 110. The buffer layer is then subjected with impinging dopant species to a pre-designated depth and density. Exact control over the density of the introduced dopant species is highly desirable to control the amount of strain introduced into the material. As non-limiting examples, dopant species include Si, Ge, Sn, Mg, Be, Zn and Cd. Although the list of ionic species suitable for this embodiment should not be limited to those previously listed, but also encompasses ionic species that are capable of incorporation in the lattice of the III-V nitride material while inducing an alteration of the in-plane lattice constant.

Example CTE Mismatch Embodiments

As a first example, a III-nitride strained donor structure 180 is formed and utilized to form a strained composite substrate 230. The strained donor structure 180 includes strained N-polar GaN donor material 130 with a thickness of (0.1μm-1000 μm), which is bonded onto a sapphire carrier substrate 150. This example substantially follows the actions and structures as outlined in FIGS. 3A-3G.

In this example, a silicon growth substrate 110 is used. Buffer layers 120, for example, AlN, AlGaN, or other suitable materials are disposed on the silicon growth substrate 110, followed by subsequent deposition of Ga-polar GaN material 130. The resulting stress in the GaN material 130 is in a −100 to 200 MPa range depending on the growth conditions and the film thickness. The expected threading dislocation density (TDD) is in a $1×10^6$-$5×10^9$/cm$^2$ range (FIG. 3A).

A sapphire carrier substrate 150 is bonded to the exposed Ga-face of the Ga-polar GaN material 130 opposite the silicon growth substrate 110 using a combination of $Si_3N_4$/$SiO_2$ as a bonding layer. The bonded structure may be strengthened by means of thermal annealing and/or the use of plasma activation as a pre-bonding surface treatment (FIG. 3B).

A rear surface of the buffer layers 120 may be exposed by eliminating the silicon growth substrate 110 by means of mechanical grinding, lapping, polishing, and etching with a selective etchant including, but not limited to, KOH, TMAH, or a mixture of HF/HNO$_3$. The buffer layers 120 may be removed to expose the underside of the GaN material 130 by means of RIE, selective etching, polishing, or combinations thereof (FIG. 3C). If desired, the thickness of the GaN material 130 may be adjusted by a process similar to that for removing the buffer layers 120.

The resultant strained donor structure 180 may be transferred onto a sapphire support substrate 210, to form a strained composite substrate 230. The transfer may be achieved with a combination of wafer bonding, wafer mechanical removal, the SMARTCUT® technology, or laser lift-off. The resultant structure is a thin-film strained Ga-polar GaN seed layer 190 on top of a sapphire support substrate 210 via the use of bonding layers ($SiO_2$/$Si_3N_4$). The GaN film is stressed to increase the in-plane lattice parameter to better match that of InGaN active device layers 240 (e.g., $In_{0.15}Ga_{0.85}N$) to be deposited thereon. Note, an alternative to this example is that the strained donor structure 180 comprises GaN material 130 bonded onto a silicon carrier substrate 150 rather than a sapphire carrier substrate.

In a second example, a III-nitride strained donor structure 180 is formed and utilized to form a strained composite substrate 230. The strained donor structure 180 includes strained N-polar GaN donor material 130 with a thickness of (0.1μm-1000 μm), which is bonded onto a sapphire carrier substrate 150. This example substantially follows the actions and structures as outlined in FIGS. 3A-3G.

In this example, a silicon carbide growth substrate 110 is used. Buffer layers 120, for example, AlN, AlGaN, or other suitable materials are disposed on the silicon carbide growth substrate 110, followed by subsequent deposition of Ga-polar GaN material 130. The resulting stress in the GaN material 130 is in a −100 to 200 MPa range depending on the growth conditions and the film thickness. The expected TDD is in a $1×10^6$-$5×10^9$/cm$^2$ range.

A sapphire carrier substrate 150 is bonded to the exposed Ga-face of the Ga-polar GaN material 130 opposite the silicon carbide growth substrate 110 using a using $SiO_2$ as a bonding layer. The bonded structure may be strengthened by means of thermal annealing and/or the use of plasma activation as a pre-bonding surface treatment.

A rear surface of the buffer layers 120 may be exposed by eliminating the silicon carbide growth substrate 110 by means of mechanical grinding, lapping, polishing, and selective etching.

In cases where the thickness of the GaN is below <1 μm, it is possible to remove the SiC using the SMARTCUT® technology by implanting ions directly in the SiC substrate, through the GaN film. In cases where the GaN film is thicker than 1 μm, the elimination of the SiC can be achieved by implanting the top GaN substrate and inducing separation above the buffer layers. In this case, there is no need to remove the buffer layers.

Otherwise, the buffer layers 120 may be removed to expose the underside of the GaN material 130 by means of RIE, selective etching, polishing, or combinations thereof. If desired, the thickness of the GaN material 130 may be adjusted by a process similar to that for removing the buffer layers 120.

The resultant strained donor structure 180 may be transferred onto a sapphire support substrate 210, to form a strained composite substrate 230. The transfer may be achieved with a combination of wafer bonding, wafer mechanical removal, the SMARTCUT® technology, or laser lift-off. The resultant structure is a thin film strained seed layer 190 that is Ga-polar on top of a sapphire support substrate 210 via the use of bonding layers ($SiO_2$/$Si_3N_4$). The GaN film is stressed to increase the in-plane lattice parameter to better match that of InGaN active device layers 240 (e.g., $In_{0.15}Ga_{0.85}N$) to be deposited thereon. Note, an alternative to this example is that the strained donor structure 180 comprises GaN bonded onto a silicon carrier substrate rather than a sapphire carrier substrate. In a further alternative, sapphire on poly-silicon carbide (SopSiC) can be utilized to replace the silicon carbide growth substrate 110.

Example Buffer Layer Embodiments

As a first example, an InGaN (or GaN) donor structure is formed. This example substantially follows the actions and structures as outlined in FIGS. 3A-3G. In this example, a sapphire growth substrate 110 is used. ZnO is deposited as a buffer layer 120 on the sapphire growth substrate 110 by means of, for example, MOVPE, HVPE, or MBE.

Lattice matched $In_{0.18}Ga_{0.82}N$ or strained GaN is grown on the surface of the ZnO buffer layer 120 via, for example, HVPE, MBE or MOCVD. The thickness of the nitride material may be maintained below the critical thickness to prevent the on-set of defect formation in the case of strained III-nitride materials growth.

A sapphire carrier substrate 150 is bonded to a surface of the strained III-nitride material 130 opposite the sapphire growth substrate 110 using $SiO_2$ as a bonding layer. The bonded structure may be strengthened by means of thermal annealing and/or the use of plasma activation as a pre-bonding surface treatment.

A rear surface of the buffer layers 120 may be exposed by eliminating the sapphire growth substrate 110 by means of wet chemical lift-off by etching the ZnO strain-inducing buffer layer 120 in dilute HCl. If desired, the thickness of the GaN material 130 may be adjusted by means of RIE, selective etching, polishing, or combinations thereof.

ZnO has a lattice parameter of 3.25 Å and therefore is lattice matched to InGaN with an indium content of approximately 18%, a common value utilized in the fabrication of light-emitting devices (also referred to herein as "photonic elements"). Moreover, ZnO is an ideal material for deposition on to sapphire due to the excellent match in thermal expansion coefficient between the two materials (i.e., both have a CTE of $8.6×10^{-6°}$ C.$^{-1}$ see Table 2 below). In addition, ZnO is etched relatively straight forwardly to separate the structure, this has been shown by Rogers et al. Applied Physics Letters 91, 071120 (2007).

The resultant strained donor structure 180 may be transferred onto a sapphire support substrate 210, or other suitable substrate, to form a strained composite substrate 230. The transfer may be achieved with a combination of wafer bonding, wafer mechanical removal, the SMARTCUT® technology, or laser lift-off. The resultant structure is a thin-film strained seed layer 190 that is Ga-face terminated on top of a sapphire support substrate 210 via the use of bonding layers ($SiO_2/Si_3N_4$).

As a second example, an InGaN (or GaN) donor structure is formed. This example substantially follows the actions and structures as outlined in FIGS. 3A-3G. In this example, a SiC growth substrate 110 is used. Aluminum Indium Nitride ($Al_xIn_{1-x}N$) with an indium content >18% is deposited as a buffer layer 120 on the SiC growth substrate 110 by means of, for example, MOVPE, HVPE, or MBE.

InGaN (or GaN) is grown on the surface of the AlInN buffer layer 120 via, for example, HVPE or MOVPE. The thickness of the nitride material may be maintained below the critical thickness to prevent the on-set of defect formation in the case of strained III-V nitride materials growth.

A sapphire carrier substrate 150 is bonded to a surface of the strained III-nitride material 130 opposite the sapphire growth substrate 110 using $SiO_2$ as a bonding layer. The bonded structure may be strengthened by means of thermal annealing and/or the use of plasma activation as a pre-bonding surface treatment.

A rear surface of the buffer layers 120 may be exposed by eliminating the SiC growth substrate 110 by means of mechanical grinding, lapping, polishing, and selective etching. The strain inducing AlInN buffer layer 120 is removed to expose the bottom part of the InGaN (or GaN) film by means of reactive ion etching, polishing, or a combination thereof. If desired, the thickness of the GaN material 130 may be adjusted by means of RIE, selective etching, polishing, or combinations thereof.

AlInN holds a great deal of potential as an alloy for nitride growth as its lattice is matched to GaN when the indium composition is approximately 18%, i.e., $Al_{0.82}In_{0.18}N$. Therefore, the strain in an over layer growth of GaN on the AlInN layer can be varied in strength and direction by adjustment around the 18% level. In other words, an increase above 18% in indium content will lead to an increase in tensile strain while a decrease below 18% will result in an increase in compressive strain. Additionally, the indium content in the AlInN layer can be increased beyond the 18% level, as described in the above example, to provide a lattice matched base for InGaN growth.

Furthermore, the utilization of a silicon carbide substrate will introduce a further degree of tensile strain into the lattice of the III-nitride donor material due to the CTE of SiC having a lesser value than that of GaN (i.e., $4.5 \times 10^{-6 \circ}$ C.$^{-1}$ compared with $5.6 \times 10^{-6 \circ}$ C.$^{-1}$). Therefore, upon wafer cool down after the III-nitride growth, the GaN layer wishes to contract more than the SiC layer but is unable to do so due to the lower CTE of the SiC layer, resulting in a tensile strain in the GaN film.

As with the other examples, a support substrate 210 may be bonded to the strained donor structure 180 and the strained composite substrate 230 may be separated from the residual strained donor structure 290.

As a third example, an InGaN (or GaN) donor structure is formed. This example substantially follows the actions and structures as outlined in FIGS. 3A-3G. In this example, a SiC growth substrate 110 is used. A thin strain layer of HfN (or ScN) is deposited as the buffer layer 120 onto the SiC growth substrate 110 by means of, for example, MOVPE, HYPE, or MBE.

InGaN (or GaN) is grown on the surface of the HfN (or ScN) buffer layer 120 via, for example, HYPE or MOVPE. The thickness of the III-nitride material may be maintained below the critical thickness to prevent the on-set of defect formation in the case of strained III-nitride materials growth.

A sapphire carrier substrate 150 is bonded to a surface of the strained III-nitride material 130 opposite the sapphire growth substrate 110 using $SiO_2$ as a bonding layer. The bonded structure may be strengthened by means of thermal annealing and/or the use of plasma activation as a pre-bonding surface treatment.

A rear surface of the buffer layers 120 may be exposed by eliminating the SiC growth substrate 110 by means of mechanical grinding, lapping, polishing, and selective etching. The strain inducing HfN (or ScN) buffer layer 120 is removed to expose the bottom part of the InGaN (or GaN) film by means of reactive ion etching, polishing, or a combination thereof. If desired, the thickness of the GaN material 130 may be adjusted by means of RIE, selective etching, polishing, or combinations thereof.

A number of transition metal compounds are closely lattice matched to the III-nitrides and are relatively stable under III-nitride growth conditions. A particularly interesting material is HfN, which has a lattice mismatch of +0.35% for GaN(0001)/HfN(111), and therefore will induce a degree of tensile strain in the subsequent III-nitride layer. Also, HfN has been demonstrated as being suitable for growth of the III-nitride materials, for example, see Armitage et al. Applied Physics Letter 81, 1450, (2002). In addition, ScN has been shown to be likewise compatible with III-nitride growth whilst inducing a tensile strain, for example, see Moram et al. Journal of Crystal Growth 298, 268 (2007). As described previously, the SiC substrate will also introduce an addition degree of tensile strain in the InGaN (GaN) layer.

As with the other examples, a support substrate 210 may be bonded to the strained donor structure 180 and the strained composite substrate 230 may be separated from the residual strained donor structure 290.

Example Ion Implantation Embodiments

As a first example, an InGaN (or GaN) donor structure is formed via the introduction of strain inducing ionic species. This example substantially follows the actions and structures as outlined in FIGS. 3A-3G. In this example, a sapphire growth substrate 110 is used. A thin GaN layer 130 is deposited onto a sapphire growth substrate 110 by means of, for example, MOVPE, HYPE, or MBE.

The thin GaN layer is doped with silicon or other suitable dopant species to a dopant density suitable to obtain a desired strain in the GaN of about $1 \times 10^{19}$ cm$^{-3}$. The dopant may be activated via annealing of the semiconductor structure to anneal out radiation damage and drive impurities into substitional (or interstitial) sites.

A subsequent layer of InGaN (or GaN) is grown on the surface of the doped (i.e., strained) layer via HVPE or MOCVD. The thickness of the nitride material is maintained below the critical thickness for the on-set of defect formation in the case of strained III-V nitride materials growth.

A sapphire carrier substrate 150 is bonded to a surface of the strained III-nitride material 130 opposite the sapphire growth substrate 110 using $SiO_2$ as a bonding layer. The bonded structure may be strengthened by means of thermal annealing and/or the use of plasma activation as a pre-bonding surface treatment.

A rear surface of the III-nitride material may be exposed by eliminating the sapphire growth substrate 110 by means of mechanical grinding, lapping, polishing, and laser lift-off. If desired, the thickness of the GaN material 130 may be adjusted by means of RIE, selective etching, polishing, or combinations thereof.

As with the other examples, a support substrate 210 may be bonded to the strained donor structure 180 and the strained composite substrate 230 may be separated from the residual strained donor structure 290.

Lattice constants and CTEs for various materials described herein are shown in Table 1 and Table 2, respectively.

TABLE 1

Lattice Constants for relevant materials.

| Material | Lattice Constant (Å) |
|---|---|
| AlN | 3.11 |
| GaN | 3.19 |
| InN | 3.53 |
| $Al_2O_3$ | 4.79 |
| SiC | 3.08 |
| ZnO | 3.25 |

TABLE 2

Coefficient of thermal expansion for relevant materials.

| Material | CTE (° $C.^{-1}$) |
|---|---|
| III-Nitride | 5.6 |
| $Al_2O_3$ | 8.6 |
| SiC | 4.5 |
| ZnO | 8.6 |
| Si | 2.5 |
| AlAs | 3.5 |
| AlSb | 4.5 |
| GaAs | 5.4 |

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A method of fabricating a semiconductor substrate, comprising:
   forming a strained donor structure by forming a III-nitride material on a first substrate with a desired lattice strain and a Ga-face on a first surface of the III-nitride material and an N-face on a second surface of the III-nitride material;
   selecting an attachment surface, wherein the attachment surface is the first surface to form an N-polar composite substrate or the second surface to form a Ga-polar composite substrate;
   forming a weakened zone in the strained donor structure at a predetermined depth to define a strained seed layer between the attachment surface and the weakened zone and a residual strained donor structure between the weakened zone and a surface opposite the attachment surface;
   bonding a support substrate to the attachment surface of the III-nitride material;
   separating the residual strained donor structure from the strained seed layer at the weakened zone to form a strained composite substrate comprising the support substrate and the strained seed layer;
   epitaxially growing at least one additional layer of semiconductor material on the strained seed layer of the strained composite substrate to deposit a device structure; and
   selecting the desired lattice strain and a resulting strained lattice parameter of the III-nitride material and a composition of the at least one additional layer of semiconductor material and causing a reduction in a difference between the strained lattice parameter of the III-nitride material of the strained seed layer and an equilibrium lattice parameter of the at least one additional layer of semiconductor material.

2. The method of claim 1, wherein forming the strained donor structure further comprises forming the III-nitride material to comprise Ga-polar III-nitride material on a growth substrate.

3. The method of claim 1, wherein forming the strained donor structure further comprises:
   forming the III-nitride material to comprise Ga-polar III-nitride material on a growth substrate;
   bonding a carrier substrate to the first surface; and
   removing the growth substrate to expose the second surface of the III-nitride material with the N-face.

4. The method of claim 1, wherein forming the III-nitride material on the first substrate with the desired lattice strain comprises selecting the first substrate to have a CTE different from a CTE of the III-nitride material such that, after a growth cycle and a cool down, the III-nitride material at room temperature is under a strain relative to the III-nitride material in a relaxed state at room temperature.

5. The method of claim 4, wherein selecting the first substrate comprises selecting the first substrate to comprise a material selected from the group consisting of Si, SiC, GaAs, and AlAs.

6. The method of claim 1, wherein forming the III-nitride material on the first substrate with the desired lattice strain further comprises forming at least one buffer layer between the first substrate and the III-nitride material, wherein an average lattice parameter of the at least one buffer layer is different from an equilibrium lattice parameter of the III-nitride material.

7. The method of claim 6, wherein the at least one buffer layer is selected from the group consisting of AlGaInN, ZnO, HfN, and ScN.

8. The method of claim 1, wherein forming the III-nitride material on the first substrate with the desired lattice strain further comprises doping the III-nitride material with a dopant and modifying a lattice parameter of the III-nitride material.

9. The method of claim 8, wherein the dopant is selected from the group consisting of Si, Ge, Sn, Mg, Be, Zn and Cd.

10. The method of claim 1, further comprising re-using the residual strained donor structure to form an additional strained composite substrate by repeating the acts of forming the weakened zone, bonding the support substrate, and separating the strained donor structure on the residual strained donor structure.

11. The method of claim 1, wherein the desired lattice strain is a tensile strain.

12. The method of claim 1, wherein the desired lattice strain is a compressive strain.

13. The method of claim 1, wherein epitaxially growing the at least one additional layer of semiconductor material on the strained seed layer of the strained composite substrate to deposit the device structure further comprises maintaining a thickness of the at least one additional layer of semiconductor material below a critical thickness of the at least one additional layer of semiconductor material and preserving strain within the at least one additional layer of semiconductor material.

14. A method of fabricating a semiconductor structure, comprising:
forming a strained donor structure, comprising:
forming a III-nitride material on a growth substrate with a desired lattice strain and a Ga-face on a first surface of the III-nitride material;
selecting the desired lattice strain and reducing lattice mismatch between the III-nitride material and at least one additional layer of semiconductor material of a device structure to be subsequently deposited on a strained seed layer comprising a portion of the III-nitride material;
bonding a carrier substrate to the first surface while at least substantially maintaining the desired lattice strain in the III-nitride material; and
removing the growth substrate to expose a second surface of the III-nitride material with an N-face;
forming a weakened zone in the strained donor structure at a predetermined depth to define the strained seed layer between the second surface and the weakened zone and a residual strained donor structure between the weakened zone and the first surface;
bonding a support substrate to the second surface of the III-nitride material while at least substantially maintaining the desired lattice strain in the III-nitride material;
separating the strained donor structure from the strained seed layer at the weakened zone to form a strained composite substrate comprising the support substrate and the strained seed layer having the desired lattice strain; and
epitaxially growing the at least one additional layer of semiconductor material on the strained seed layer of the strained composite substrate and forming the device structure;
selecting a composition of the at least one additional layer of semiconductor material and a strained lattice parameter of the strained seed layer such that a difference between the strained lattice parameter of the strained seed layer and an equilibrium lattice parameter of the at least one additional layer of semiconductor material is reduced relative to a difference between an equilibrium lattice parameter of the seed layer and the equilibrium lattice parameter of the at least one additional layer of semiconductor material.

15. The method of claim 14, wherein forming the III-nitride material on the growth substrate with the desired lattice strain comprises selecting the growth substrate to have a CTE different from a CTE of the III-nitride material such that, after a growth cycle and a cool down, the III-nitride material at room temperature is placed under a strain relative to the III-nitride material in a relaxed state at room temperature.

16. The method of claim 15, wherein selecting the growth substrate comprises selecting the first substrate to comprise a material selected from the group consisting of Si, SiC, GaAs, and AlAs.

17. The method of claim 14, wherein forming the III-nitride material on the growth substrate with the desired lattice strain further comprises forming at least one buffer layer between the growth substrate and the III-nitride material, wherein an average lattice parameter of the at least one buffer layer is different from an equilibrium lattice parameter of the III-nitride material.

18. The method of claim 17, wherein the at least one buffer layer is selected from the group consisting of AlGaInN, ZnO, HfN, and ScN.

19. The method of claim 14, wherein forming the III-nitride material on the growth substrate with the desired lattice strain further comprises doping the III-nitride material with a dopant and modifying a lattice parameter of the III-nitride material.

20. The method of claim 19, wherein the dopant is selected from the group consisting of Si, Ge, Sn, Mg, Be, Zn and Cd.

21. The method of claim 14, further comprising re-using the residual strained donor structure to form an additional strained composite substrate by repeating the acts of forming the weakened zone, bonding the support substrate, and separating the strained donor structure on the residual strained donor structure.

22. The method of claim 14, wherein the desired lattice strain is a tensile strain.

23. The method of claim 14, wherein the desired lattice strain is a compressive strain.

24. The method of claim 14, wherein epitaxially growing the at least one additional layer of semiconductor material on the strained seed layer of the strained composite substrate and forming the device structure further comprises maintaining a thickness of the at least one additional layer of semiconductor material below a critical thickness of the at least one additional layer of semiconductor material and preserving strain within the at least one additional layer of semiconductor material.

25. A semiconductor structure, comprising:
a support substrate;
a strained GaN seed layer disposed on the support substrate, the strained GaN seed layer being in a state of tensile strain and having a selected strained lattice parameter; and
a device structure including at least one epitaxial layer of InGaN on the strained GaN seed layer.

26. The semiconductor structure of claim 25, wherein the strained GaN seed layer has a Ga-face polarity on a surface of the strained GaN seed layer adjacent the layer of InGaN.

27. The semiconductor structure of claim 25, wherein the strained GaN seed layer has an N-face polarity on a surface of the strained GaN seed layer adjacent the layer of InGaN.

28. The semiconductor structure of claim 25, wherein the at least one epitaxial layer of InGaN is in a strained state and has a thickness below a critical thickness of the at least one epitaxial layer of InGaN.

29. A semiconductor device, comprising:
a strained composite substrate comprising:
a support substrate; and
a strained GaN seed layer disposed on the support substrate, the strained GaN seed layer being in a state of tensile strain and having a selected strained lattice parameter; and
semiconductor device layers disposed on the strained GaN seed layer to form at least one electronic element, at least one photonic element, or a combination thereof, the semiconductor device layers including an epitaxial layer of InGaN on the strained GaN seed layer.

30. The semiconductor device of claim 29, wherein the strained GaN seed layer has a Ga-face polarity on a surface of the strained GaN seed layer adjacent the epitaxial layer of InGaN.

31. The semiconductor device of claim 29, wherein the strained GaN seed layer has an N-face polarity on a surface of the strained GaN seed layer adjacent the epitaxial layer of InGaN.

32. The semiconductor device of claim 29, wherein the epitaxial layer of InGaN is in a strained state and has a thickness below a critical thickness of the epitaxial layer of InGaN.

* * * * *